United States Patent
Sugita et al.

(10) Patent No.: US 6,873,007 B2
(45) Date of Patent: Mar. 29, 2005

(54) NONVOLATILE SEMICONDUCTOR MEMORY DEVICE AND PROCESS FOR PRODUCING THE SAME

(75) Inventors: Yasuhiro Sugita, Tenri (JP); Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 15 days.

(21) Appl. No.: 10/657,195

(22) Filed: Sep. 9, 2003

(65) Prior Publication Data

US 2004/0051133 A1 Mar. 18, 2004

(30) Foreign Application Priority Data

Sep. 13, 2002  (JP) ........................................ 2002-268937

(51) Int. Cl.$^7$ ............................................. H01L 29/788
(52) U.S. Cl. ..................................... 257/321; 257/758
(58) Field of Search ................................ 257/315, 316, 257/321, 322, 758

(56) References Cited

U.S. PATENT DOCUMENTS

| | | | | |
|---|---|---|---|---|
| 4,825,271 A | * | 4/1989 | Tanaka et al. | 257/316 |
| 5,883,406 A | * | 3/1999 | Nishizawa | 257/315 |
| 6,204,529 B1 | * | 3/2001 | Lung et al. | 257/321 |
| 6,437,424 B1 | * | 8/2002 | Noma et al. | 257/315 |

FOREIGN PATENT DOCUMENTS

JP  09-092739  4/1997

* cited by examiner

Primary Examiner—Chandra Chaudhari
(74) Attorney, Agent, or Firm—Nixon & Vanderhye, P.C.

(57) ABSTRACT

A nonvolatile semiconductor memory device, including: a group of memory cells formed in X and Y directions in and on a semiconductor substrate, the X and Y directions crossing each other, each memory cell including source and drain regions formed in the substrate, a first insulating film formed on a surface of the substrate between the source and drain regions, a floating gate formed on the first insulating film, and a control gate formed above the floating gate via a second insulating film; a plurality of wordlines each connected to the control gates of the memory cells in the X direction; a plurality of sub-bit lines, each sub-bit line connected to a predetermined number of source and drain regions of the memory cells in the Y direction; a plurality of main-bit lines extending in the Y direction, each main-bit line being connected to the sub-bit line in the Y direction, and a plurality of dielectric layers laminated on the sub-bit lines, wherein each main-bit line is formed on any one of the plurality of dielectric layers, each main-bit line being connected to the corresponding sub-bit line via a conductive member penetrating through the dielectric layer under the main-bit line, and adjacent two of the main-bit lines are located on different dielectric layers.

7 Claims, 17 Drawing Sheets

FIG.15   PRIOR ART

| OPERATION | PROGRAM (C23,C43) | ERASE (all cells) | READ (C33) |
|---|---|---|---|
| MBL1 | 0V Floating | -8V | 0V |
| MBL2 | 4V | -8V | 0V |
| MBL3 | 0V Floating | -8V | 0V |
| MBL4 | 4V | -8V | 1V Floating |
| MBL5 | 0V Floating | -8V | 1V Floating |
| MBL6 | 0V Floating | -8V | 1V |
| WL1 | 0V | 12V | 0V |
| WL2 | 0V | 12V | 0V |
| WL3 | -12V | 12V | 3V |
| WL30 | 0V | 12V | 0V |
| WL31 | 0V | 12V | 0V |
| WL32 | 0V | 12V | 0V |
| SG2 | 12V | 0V | 4V |
| SG3 | 12V | 0V | 4V |
| Sub | 0V | -8V | 0V |

NONVOLATILE SEMICONDUCTOR MEMORY DEVICE AND PROCESS FOR PRODUCING THE SAME

CROSS-REFERENCE TO RELATED APPLICATION

This application is related to Japanese application No. 2002-268937 filed on Sep. 13, 2002, whose priority is claimed under 35 USC § 119, the disclosure of which is incorporated by reference in its entirety.

BACKGROUND OF THE INVENTION

1. Field of the Invention

The present invention relates to a nonvolatile semiconductor memory device which has a floating gate and upon which data can be electrically written and erased. More particularly, it relates to a nonvolatile semiconductor memory device with a structure where error-writing of data is less prone to occur.

2. Description of Related Art

Included in nonvolatile semiconductor memory devices is a so-called flash memory upon which data can be electrically written and erased.

In this flash memory, by applying a positive or negative high voltage between a source or drain region and a control gate, electrons are extracted from a floating gate so that a data is written and electrons are injected into the floating gate so that the data is erased.

Among such electrically writable and erasable flash memories is one called an ACT (Asymmetrical Contactless Transistor) type flash memory which utilizes an FN tunnel phenomenon for both writing and erasing and which has a memory-array structure where a virtual-ground system is employed.

Now, a brief explanation will be given to the virtual ground system. In the virtual ground system with such a memory-array structure that memory cells are arranged in a matrix with X and Y directions crossing substantially at a right angle (the word "substantially" is used because the angle is not necessarily required to be a right angle as long as the X and Y directions cross each other so as to form a matrix) and that wordlines extend in the X direction and bit lines extend in the Y direction, each bit line is electrically connected to a single impurity diffusion layer that constitutes both a source region of one memory cell and a drain region of an adjacent memory cell in the X direction. Therefore, in this virtual-ground system, each bit line serves both as a source wiring for one memory cell and as a drain wiring for the other memory cell, and is not fixed either as the source wiring or the drain wiring, but the source wiring (being commonly grounded) and the drain wiring are appropriately switched, as disclosed in, for example, Japanese Unexamined Patent Publication No. Hei 9(1997)-92739.

FIG. 11 is a plan view illustrating an ACT-type flash memory cell array of prior art in which the virtual-ground system is employed. FIG. 12 is a cross section taken along line X–X' (along a wordline) of FIG. 11. FIG. 13 is a cross section taken along line Y1–Y1' (along a bit line) of FIG. 11. FIG. 14 is a diagram illustrating an equivalent circuit of the ACT-type flash memory cell array.

Referring to FIGS. 11 to 14, C ($C_{11}$, $C_{12}$, ..., $C_{ij}$, ..., $C_{532}$) denotes a memory cell, WL ($WL_1$, $WL_2$, ..., $WL_{32}$) a word line, MBL ($MBL_1$, $MBL_2$, ..., $MBL_6$) a main-bit line, SBL ($SBL_1$, $SBL_2$, ..., $SBL_6$) a sub-bit line made of a buried impurity diffusion layer, SG ($SG_1$ to $SG_4$) a selection gate constituted of a switching element such as a transistor or the like, and BC a bit-line contact for electrically connecting the main-bit line MBL to the sub-bit line SBL.

In FIGS. 12 and 13, reference numeral 1 denotes a semiconductor substrate, 2 a source region made of a low-concentration $n^-$-type impurity diffusion layer, 3 a drain region made of a high-concentration $n^+$-type impurity diffusion layer, 4 a tunnel oxide film, 5 a floating gate, 6 a buried oxide film, 7 an ONO film (oxide film/nitride film/oxide film), 8 an interlayer dielectric film for insulating and separating the word line WL from the main-bit line MBL, 10 an isolation region, 11 a bit-line contact (corresponding to the BC of FIG. 11), and 16 a control gate (constituted of a portion of the wordline facing the floating gate 5). Reference numeral 9 denotes a capacity existing between the adjacent main-bit lines that is schematically illustrated in FIG. 12.

As shown in FIG. 12, the control gates 16 of the cells arranged in the X direction are continuously connected together to form the wordline WL (in this figure, $WL_3$).

A impurity diffusion layer that constitutes the source region 2 of one memory cell and the drain region 3 of an adjacent memory cell in the X direction serves as the sub-bit line SBL ($SBL_1$, $SBL_2$, ...) to electrically connect the memory cells with one another along the Y direction. The sub-bit line SBL is connected to the main-bit line MBL via the selection gate SG by the bit-line contact 11 (corresponding to the BC of FIG. 11). The main-bit lines MBL are formed above the wordlines WL via the interlayer dielectric film 8.

As described above, the ACT-type memory cell has an n-channel-transistor structure provided with the lightly doped source region 2, the heavily doped drain region 3 and the floating gate 5. The asymmetric distribution of impurity concentration in the source region 2 and drain region 3 makes it possible to utilize the FN tunnel phenomenon for both writing and erasing and to realize the simple virtual-ground structure.

In other words, the memory cell array, as shown in FIG. 11 and FIG. 14 (equivalent circuit), is allowed to have the virtual-ground structure in which the sub-bit line SBL of a single impurity diffusion layer is shared by the source region 2 of one memory cell and the drain region 3 of an adjacent memory cell in the X direction. The sub-bit lines SBL are arranged in parallel to the main-bit lines MBL, while the wordlines WL are arranged to cross substantially at a right angle both the sub-bit lines SBL and the main-bit lines MBL.

In this memory cell array where the sub-bit lines arranged in the Y direction are divided by an isolation region 10 formed by injecting boron ions, utilizing p-n junctions, no field oxide film is required, making it possible to realize high integration of memory cells.

This kind of memory where the memory cells are arranged in parallel is classified as a NOR-type flash memory.

The operation principle of the ACT-type memory cell will now be explained with reference to FIGS. 14 and 15.

In a writing operation, electrons are extracted from the floating gate 5 into the drain region 3 through the FN tunnel phenomenon to lower a threshold voltage. For example, for writing the memory cell $C_{23}$ (a cell to be written is referred as a selected cell), –12V is applied to the selected wordline $WL_3$ and +4V is applied to the main-bit line $MBL_2$, so that +4V is applied to the sub-bit line $SBL_2$ via the selection gate $SG_3$ from the main-bit line $MBL_2$. As a result, +4V is applied to the drain region 3, thereby lowering the threshold voltage to 1V–2V.

At this time, the same writing voltage is applied also to the adjacent cell $C_{13}$ which is not to be written (a cell which is not to be written is referred to as a non-selected cell). However, an electric field intensity at a portion of the tunnel oxide film 4 closer to the $n^-$-type source region 2 is smaller than one at a portion of the tunnel oxide film 4 closer to the $n^+$-type drain region 3, because a depletion layer directly below the tunnel oxide film 4 in the $n^-$-type source region 2 serves to reduce the electric field intensity at the portion closer to the $n^-$-type source region 2. As a result, a non-selected cell adjacent to a cell written along the line constituted of the control gates (i.e., the wordline $WL_3$) will not be written even if the writing voltage is applied thereto. This is why the writing operation utilizing the FN tunnel phenomenon can be performed while realizing the virtual-ground structure.

In an erasing operation, +12V is applied to a selected wordline and −8V is applied to the silicon substrate 1, to the sub-bit line SBL and to the main-bit line MBL, respectively, so that electrons are injected into the floating gate 5 from the silicon substrate 1 through the FN tunnel phenomenon in a channel region to raise the threshold voltage to 4V or more. The erasing operation is can be performed per block defined as an area between the selection gate SG and the isolation region 10 or per wordline.

In a reading operation for, for example, reading the selected cell $C_{33}$, +3V is applied to the selected wordline $WL_3$, a source voltage +1V is applied to the $SBL_4$ and a drain voltage 0V is applied to the $SBL_3$, and it is decided whether or not the selected cell $C_{33}$ is in a written state or an erased state depending on whether or not a current flows through the selected cell $C_{33}$.

In a flash memory, a high voltage is applied between a drain region and a control gate such that the voltage of the control gate is negative with respect to that of the drain region for the writing and a high voltage is applied between a source region and the control gate such that the voltage of the control gate is positive with respect to that of the source region for the injection. For this purpose, a high voltage is applied to a selected main-bit line MBL for applying the high voltage to the source and drain region of a selected cell, while a non-selected main-bit line MBL connected to a non-selected cell is put in a 0V floating state.

In the aforementioned ACT-type memory, +4V is applied to the selected bit line MBL, while the non-selected bit line MBL is put in a 0V floating state.

As shown in FIG. 14, in the case of the non-selected $C_{33}$ between the two selected cells $C_{23}$ and $C_{43}$, +4V is applied to the selected bit lines $MBL_2$ and $MBL_4$, respectively, while the non-selected bit line $MBL_3$ is put in a 0V floating state.

Here, the capacities 9 exists between the adjacent main-bit lines MBL, as shown in FIG. 12. This is because the main-bit lines MBL, which are made of a conductive material such as a metal, are arranged side by side with small gaps therebetween in the interlayer dielectric layer 8, so that capacitors are formed between the adjacent main-bit lines MBL, thereby electrical coupling the adjacent main-bit lines MBL. Each capacity 9 increase as the distance between the adjacent main-bit lines MBL reduces with the advancement of the integration of the ACT-type memory.

The electrical coupling between the adjacent main-bit lines may possibly give rise to the following problem. When a main-bit line MBL is selected and a high voltage is applied thereto, an adjacent non-selected main-bit line MBL may be influenced by the high voltage and caused to float, so that electrons may be extracted in error from the floating gate 5 of a non-selected cell which is connected to the non-selected main-bit line MBL. For example, assume that the main-bit lines $MBL_2$ and $MBL_4$ are selected, as shown in the equivalent circuit of FIG. 14. Then, the non-selected bit line $MBL_3$, which is capacity-coupled to the main-bit lines $MBL_2$ and $MBL_4$, is influenced by a high voltage to the main-bit lines $MBL_2$ and $MBL_4$, and the voltage of the non-selected bit line $MBL_3$ is raised up to, for example, about 1.5 V, so that electrons are extracted from the floating gate 5 of the non-selected cell $C_{33}$ into the sub-bit line $SBL_3$. Thus, a threshold voltage of the non-selected cell $C_{33}$ is lowered, resulting in occurrence of error-writing.

FIG. 17 is a distribution graph of threshold value plotted against the number of memory cells after writing of the ACT-type memory (a memory where main-bit lines are arranged on the same plane) shown in FIG. 12. This graph is for explaining error-writing by an example and corresponds to FIG. 10. Owing to the floating phenomenon of a non-selected main-bit line MBL at the time of writing, electrons are extracted from the floating gate 5 of a non-selected cell which is in an erase-state, lowering a threshold voltage of the non-selected cell. As a result, the non-selected cell is written in error. The area X is the written cells in error.

Such error-writing is performed not only in the ACT-type memory, but also in a flash memory where electrical coupling occurs between the adjacent main-bit lines so that floating of a non-selected main-bit line adjacent to a selected main-bit line is caused at the time of writing, and in a nonvolatile semiconductor memory device.

A measure to inhibit the floating of a non-selected main-bit line may be to put the non-selected main-bit line in a 0V-forced-application state (a state created by forcedly applying to it a voltage 0V externally so that it is fixed at 0V), instead of putting the non-selected main-bit line in a 0V-floating state (a state created by first setting it at 0V and next isolating it from external circuits so that it is in a floating state).

However, depending on the kind and use of a nonvolatile semiconductor memory device, it may be difficult to use the device in a 0V-forced state.

Especially in the Act-type memory, where the virtual-ground structure is used, the presence of an off-state-leakage current between a source region and a drain region of a non-selected cell produce a current flow between a selected man bit line (+4V) and a non-selected main-bit line (0V) as shown in FIG. 16, which increase current consumption at the time of writing. Also, the presence of the off-state-leakage current causes current decrease at a main-bit line resistor and a sub-bit line resistor, so that a voltage supplied to the drain region of a selected memory cell becomes lower than a voltage applied, which reduces a writing rate.

SUMMARY OF THE INVENTION

It is an object of the present invention to provide a nonvolatile semiconductor memory device where an error-writing to a non-selected memory cell is prevented.

Another object of the invention is to provide a nonvolatile semiconductor memory device with high degree of integration where a floating phenomenon of a non-selected main-bit line adjacent to a selected main-bit line is prevented.

A more specific object of the present invention is to provide a nonvolatile semiconductor memory device with high degree of integration due to a virtual-ground memory structure, wherein current consumption is suppressed, a writing rate is maintained and reliability in writing operation is high because of a suppressed floating phenomenon of a non-selected main-bit line adjacent to a selected main-bit line.

A further object of the present invention is to provide a process for producing the above-mentioned nonvolatile semiconductor memory devices.

The present invention provides a nonvolatile semiconductor memory device, comprising:

a group of memory cells formed in X and Y directions in and on a semiconductor substrate, the X and Y directions crossing each other, each memory cell including source and drain regions formed in the substrate, a first insulating film formed on a surface of the substrate between the source and drain regions; a floating gate formed on the first insulating film, and a control gate formed above the floating gate via a second insulating film;

a plurality of wordlines connected to the control gates of the memory cells in the X direction;

a plurality of sub-bit lines formed in the substrate, each sub-bit line connected to a predetermined number of source and drain regions of the memory cells in the Y direction;

a plurality of main-bit lines extending in the Y direction, each main-bit line being connected to the sub-bit lines in the Y direction, and a plurality of dielectric layers laminated on the sub-bit lines, wherein each main-bit line is formed on any one of the plurality of dielectric layers, each main-bit line being connected to the corresponding sub-bit line via a conductive member penetrating through the dielectric layer under the main-bit line, and adjacent two of the main-bit lines are located on different dielectric layers.

According to the present invention, a plurality of wordlines are each formed so as to connect together in a X direction control gates of memory cells formed in X and Y directions crossing each other in and on a semiconductor substrate.

A plurality of sub-bit lines are each formed in the semiconductor substrate so as to connect together source and drain regions of the adjacent memory cells in a Y direction that the X direction crosses substantially at a right angle. Also, a plurality of main-bit lines are formed above the wordline. The plurality of main-bit lines consist of upper-layer main-bit lines and lower-layer main bit lines arranged alternately. The lower-layer main bit line is formed above the wordline via a first interlayer dielectric film and connected to the sub-bit line by a first bit-line contact. The upper-layer main-bit line is formed above the wordline via both the first interlayer dielectric film and a second interlayer dielectric film and connected to the sub-bit line by a second bit-line contact. The adjacent main bit lines are formed not in the same plane but in different layers. This makes it possible to provide a long distance between the adjacent main-bit lines so as to reduce a capacity occurring by coupling between them, while preventing the influence of a high voltage applied to one main-bit line from being given to its adjacent main-bit line so as to suppress the floating thereof.

Also, the sub-bit line may be positioned between adjacent two of the memory cells in the X direction and comprises a first and second diffusion layers, the first diffusion layer being heavily impurity-doped and located below the floating gate of one memory cell to serve as the source region, the second diffusion layer being lightly impurity-doped and located below the floating gate of the other memory cell to serve as the drain region.

This allows the nonvolatile semiconductor memory device to have a virtual-ground structure, and thereby to be improved in integration degree.

Moreover, the main-bit line may be made of a metal. This allows a resistance of the main-bit line to be lessen, which increases a writing rate and a reading rate.

Further, each main-bit line may be formed directly above the sub-bit line connected thereto by the bit-line contact. This allows the first bit-line contact and the second bit-line contacts to be each formed perpendicularly, which facilitates connecting elements.

The dielectric layers may consists of a first dielectric layer on the sub bit lines and a second dielectric layer on the first dielectric layer, wherein the main bit lines consists of a plurality of first-layer main-bit lines formed on the first dielectric layer and a plurality of second-layer main-bit lines formed on the second dielectric layer, wherein the conductive member connecting the second-layer main-bit line and the corresponding sub-bit line consists of a first member passing through the first dielectric layer, a second member passing through the second dielectric layer and a connection pad to connect the first member and the second member, the connection pad formed on the first dielectric layer.

This allows the first conductive member and the second conductive member to be formed sequentially in separate steps and, by the use of the connection pad, to be connected without misalignment.

The second-layer main-bit line may be arranged directly above the first-layer main-bit line provided with a laterally extended connection portion, wherein the first member is located perpendicular on the sub-bit line.

With this constitution, the first-layer main-bit line and the upper-layer main-bit line do not necessarily need to be formed in a staggered arrangement.

The connection pad may made of the same material as that used for the first-layer main-bit line and may be formed simultaneously with the formation thereof.

This allows the connection pad to be formed in the same step as that of forming the first-layer main-bit line, which reduces the number of production steps.

Further, the present invention provides a process for producing a nonvolatile semiconductor memory device comprising the steps of: (a) forming a group of memory cells in X and Y directions closing each other in and on a semiconductor substrate, the formation of the memory cells including forming source and drain regions of each memory cell in the substrate, forming a plurality of sub-bit lines each in a stripe shape in the substrate, the sub-bit line connecting a predetermined number of source and drain regions in the Y direction, forming a first insulating film, a floating gate, a second insulating film and a control gate on a surface of the substrate between each source and drain regions, and forming a plurality of wordlines each in a stripe shape, the wordline connecting the control gates in the X direction; (b) forming a first dielectric layer on the memory cells; (c) forming a plurality of first conductive members in the first dielectric layer, each first conductive member being connected electrically to the sub-bit line and extending to an upper surface of the first dielectric layer; (d) forming a plurality of first-layer main-bit lines and a plurality of connection pads on the first dielectric layer, each first-layer main-bit line being connected to the first conductive member and arranged in a stripe shape along the Y direction, each connection pad being connected to the first conductive member ; (e) forming a second dielectric layer on those of the first dielectric layer, the first-layer main-bit lines and the connection pads; (n forming a plurality of second conductive members in the second dielectric layer, each second conductive members being connected electrically to the connection pad and extending to an upper surface of the second dielectric layer; and (g) forming a plurality of second-layer main-bit lines on the second dielectric layer, each second-layer main-bit line being connected to the second conductive member and arranged in a stripe shape along the Y direction.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 15 is a view showing operating voltages of the ACT-type memory of the prior art;

DESCRIPTION OF THE PREFERRED EMBODIMENTS

Figure 1:
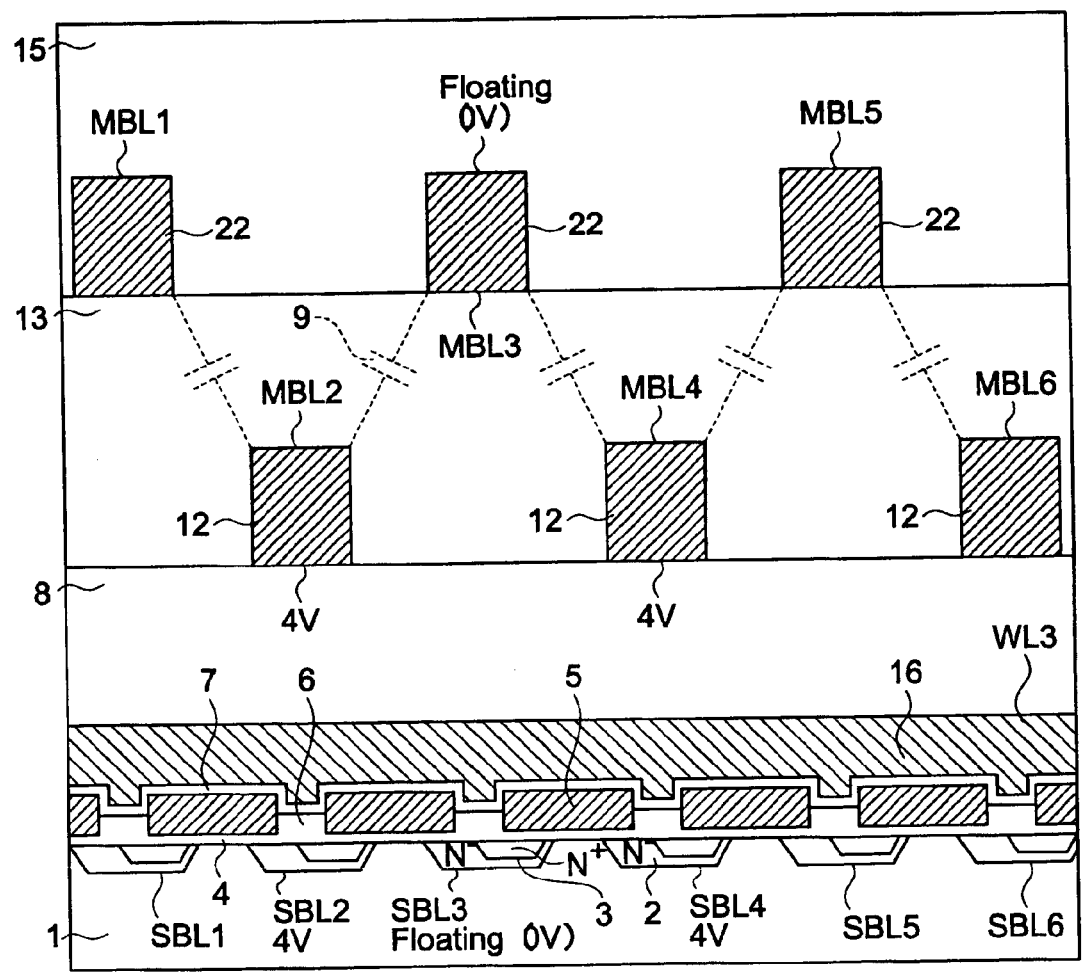
FIG. 1 is a cross section taken along a wordline of an ACT-type memory according to an embodiment of the present invention.

The present invention will now be explained in detail based on the preferred embodiments shown in the drawings. It should be understood that the present invention is not limited to the embodiments.

Figure 14:
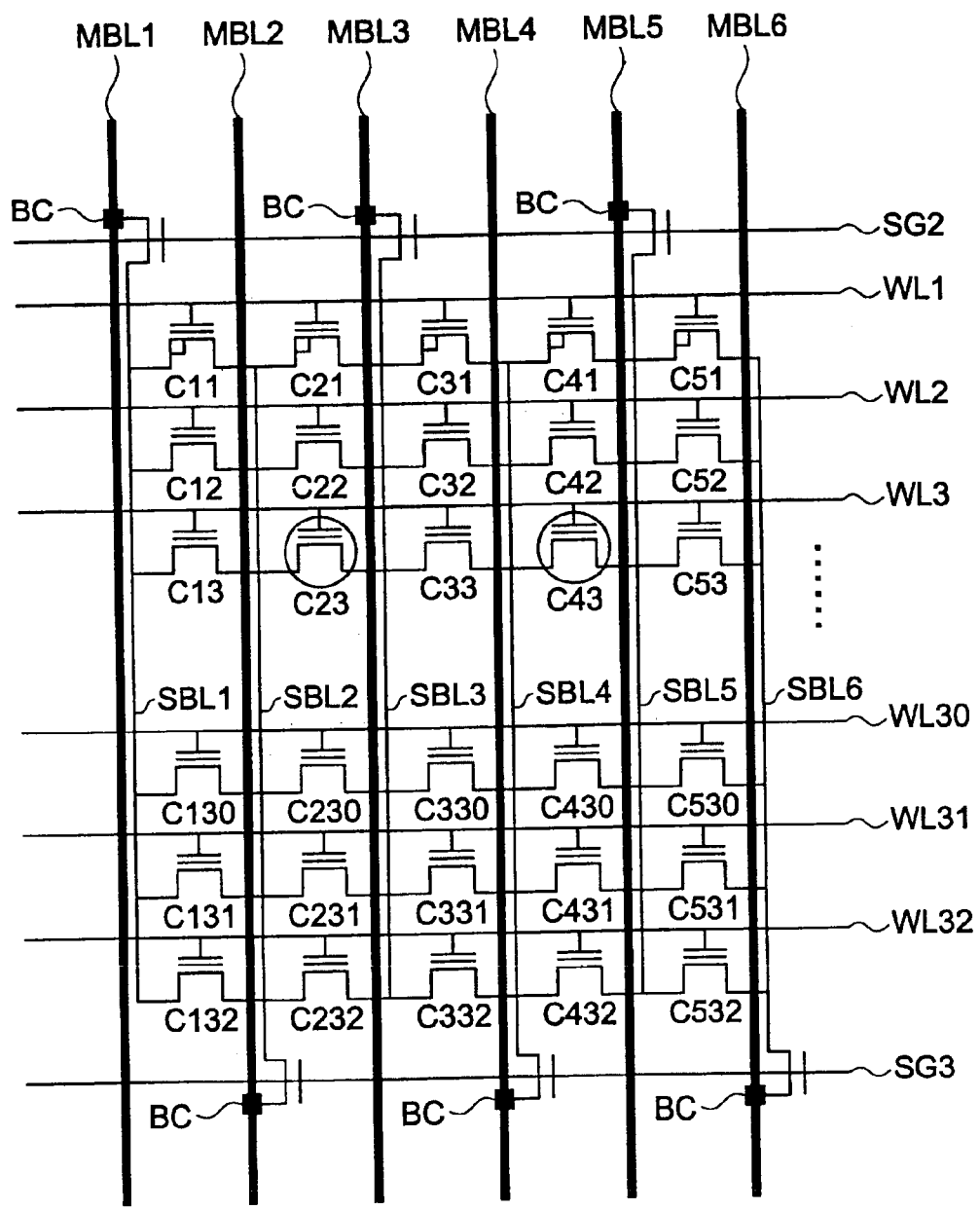
FIG. 14 is a diagram illustrating an equivalent circuit of the ACT-type memory of the prior art.
Figure 16:
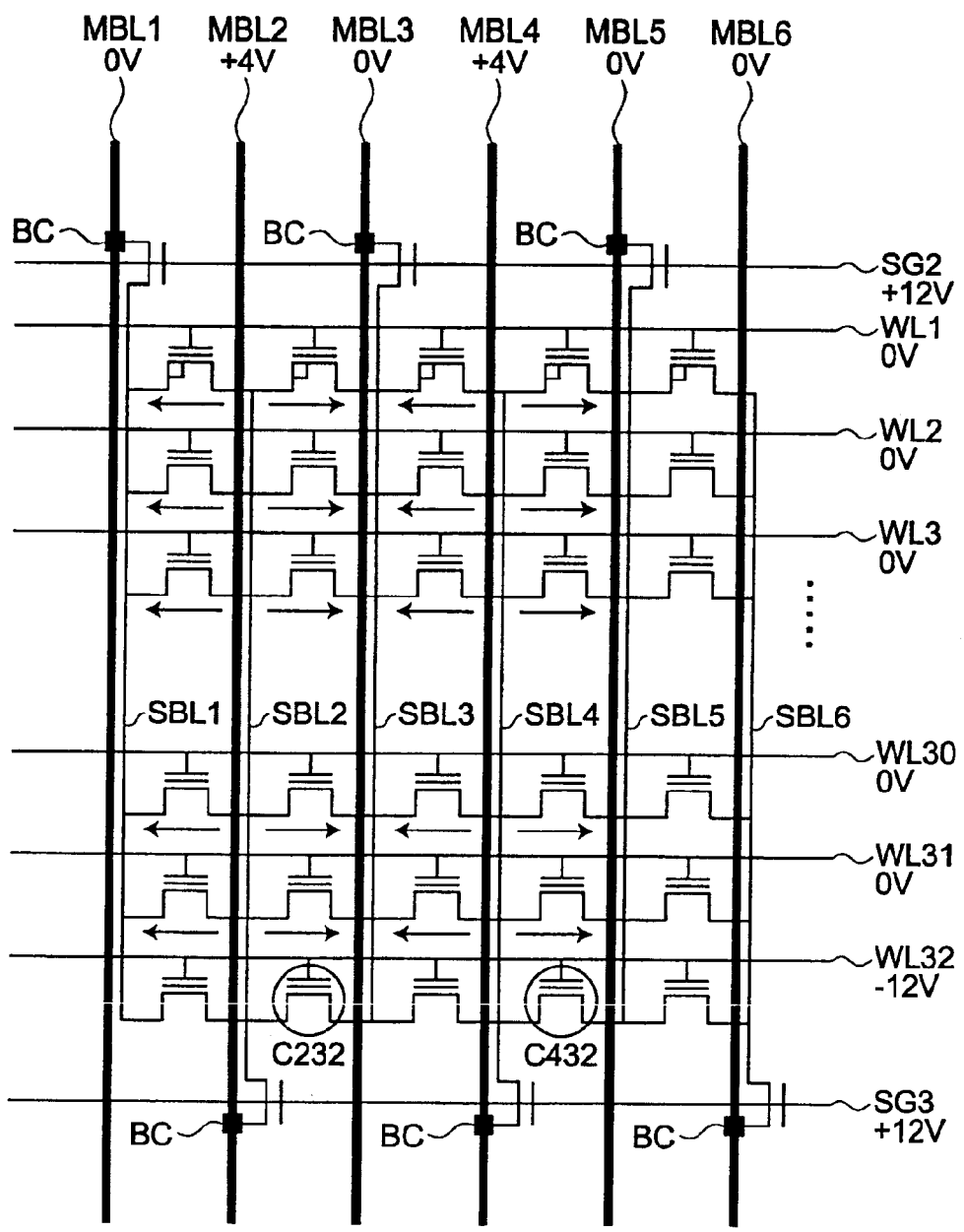
FIG. 16 is a diagram for explaining off-state-leakage currents in the ACT-type memory of the prior art.

Though a nonvolatile semiconductor memory device in FIG. 11 and its equivalent circuit in FIG. 14 are illustrated as those of prior art, the reference numerals and symbols therein are used also for explaining the present invention, since the elements denoted by the reference numerals and symbols are substantially identical to those of a nonvolatile semiconductor memory device and its equivalent circuit in the following embodiments of the present invention.

Figure 2:
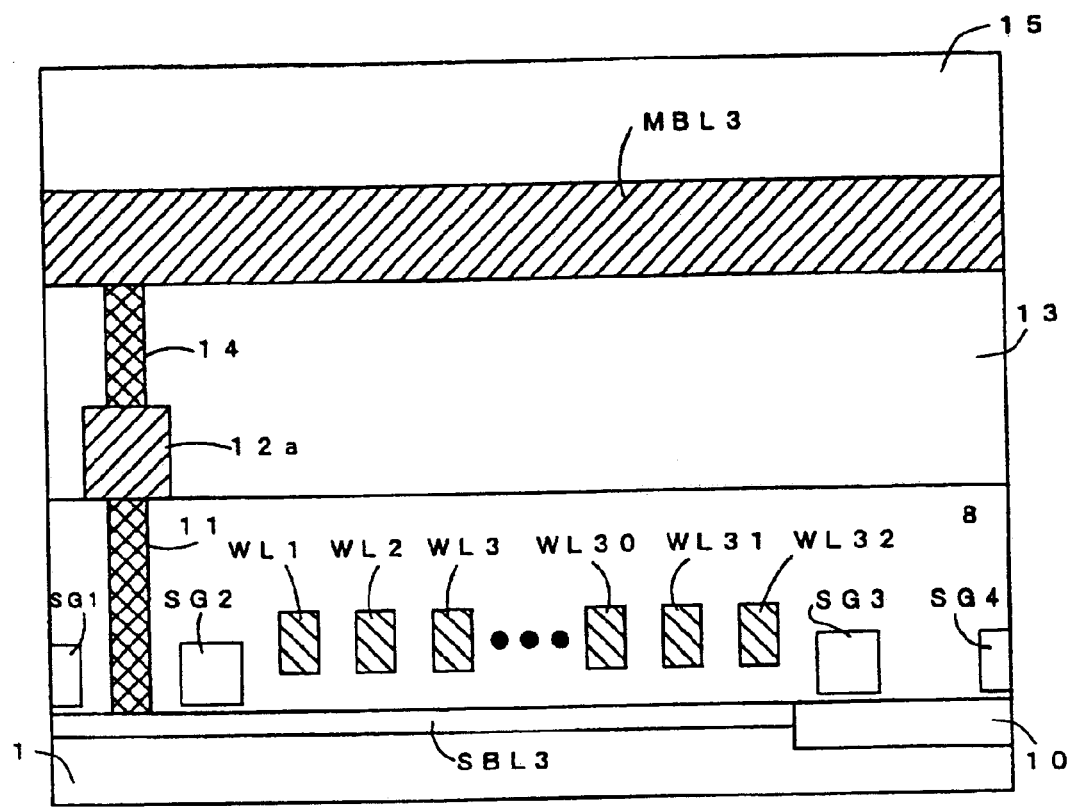
FIG. 2 is a cross section taken along a bit line (even-numbered main-bit line) of the ACT-type memory according to the embodiment of the present invention.
Figure 3:
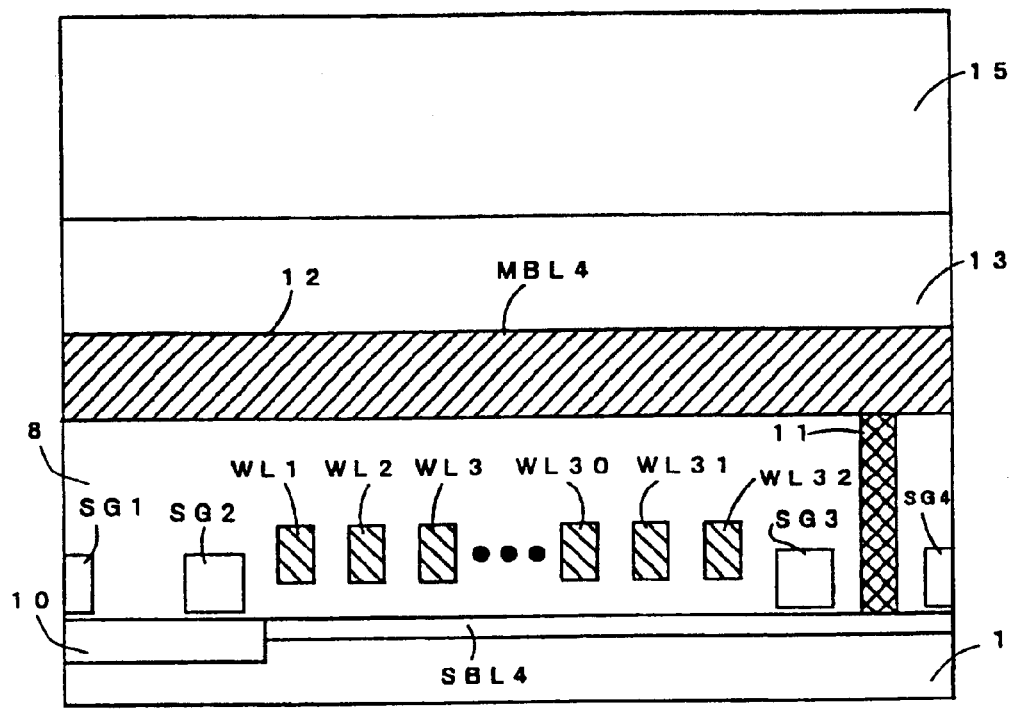
FIG. 3 is a cross section taken along a bit line (odd-numbered main-bit line) of the ACT-type memory according to the embodiment of the present invention.
Figure 11:
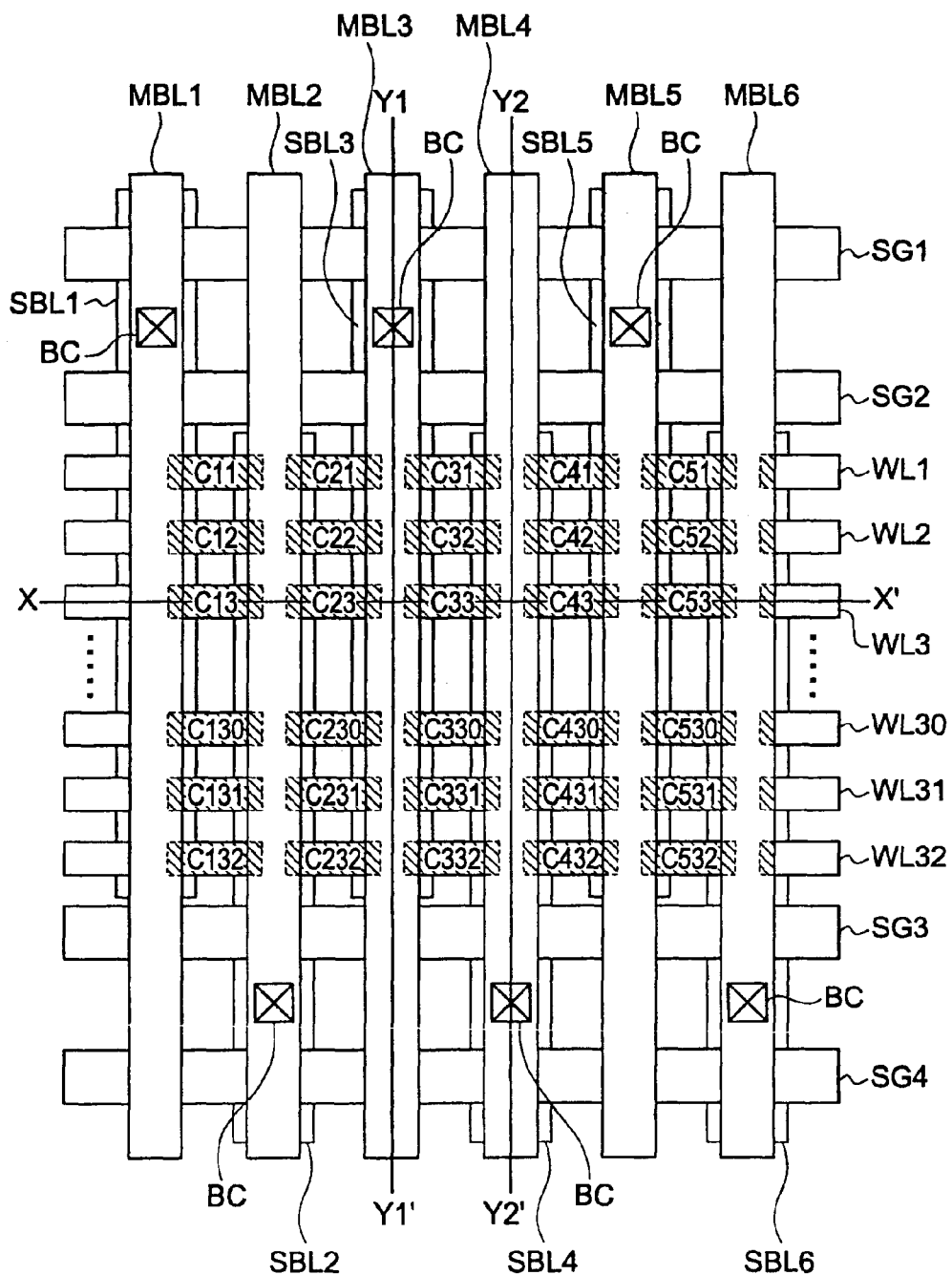
FIG. 11 is a plan view of an ACT-type memory of prior art.
Figure 12:
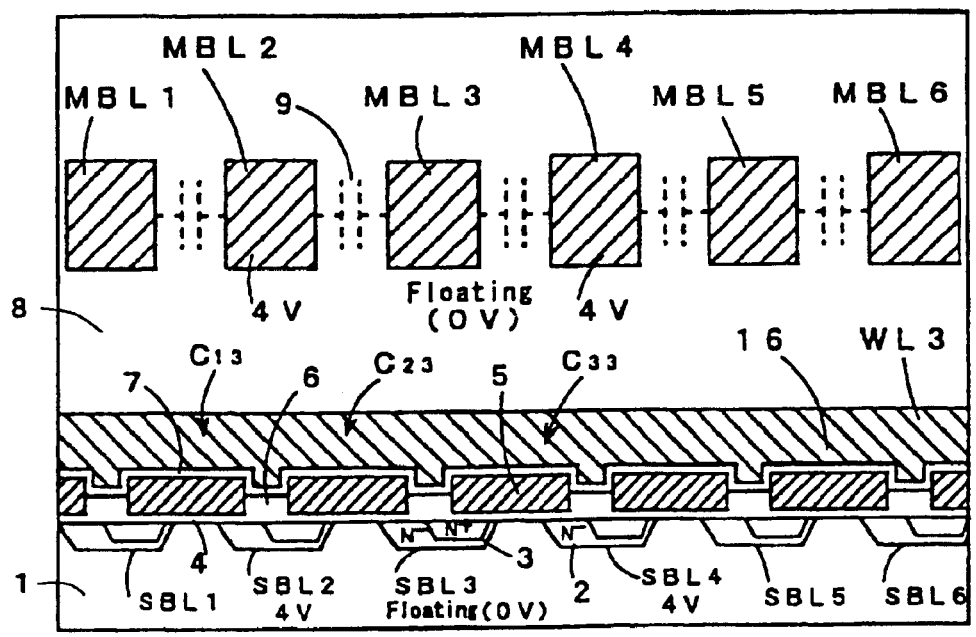
FIG. 12 is a cross section taken along line X–X' (a word line) of FIG. 11.
Figure 13:
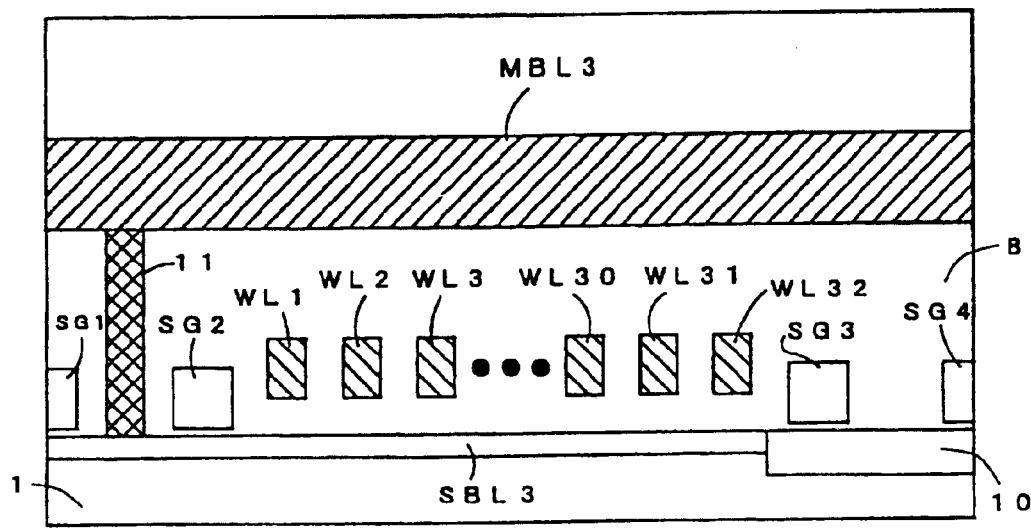
FIG. 13 is a cross section taken along line Y1–Y1' (a bit line) of FIG. 11.

FIG. 1 is a cross section of a nonvolatile semiconductor memory device according to an embodiment of the present invention taken along a wordline, and specifically along line X–X' of FIG. 11. FIG. 2 is a cross section taken along a bit line, and specifically along line Y1–Y1' of FIG. 11. FIG. 3 is a cross section taken also along a bit line, and specifically along line Y2–Y2' of FIG. 11.

As shown in FIGS. 1 to 3, an $n^-$-type impurity diffusion layer is formed in a semiconductor substrate (for example, silicon substrate) 1. A left region in this $n^-$-type impurity diffusion layer functions as a source region 2, and further, in a right region in the $n^-$-type impurity diffusion layer, an $n^+$-type impurity diffusion layer is formed which functions as a drain region 3.

A memory cell is so formed as to bridge between first and second $n^-$-type impurity diffusion layers which are adjacent to each other, and is constituted of the source region 2 formed in the first $n^-$-type impurity diffusion layer, the drain region 3 formed in the second $n^-$-type impurity diffusion layer, a tunnel oxide film 4 formed on a surface of the substrate between the source region 2 and the drain region 3, a floating gate 5 formed above the tunnel oxide film 4, and a control gate 16 formed above the floating gate 5 via an ONO film 7.

The control gate 16 is constituted of a portion of a wordline WL (in FIG. 1, $WL_3$) that faces the floating gate 5. This means that though the wordline WL is provided as a signal line, portions of the wordline WL serve also as the control gates 16 of the memory cells. The wordline WL is made of a polysilicon film but may be made of a conductive film or of a laminate film of such films. The wordline WL is connected to the memory cells along an X direction that serves as a channel direction of the memory cells.

Also, buried oxide films 6 for isolating the memory cells from one another are formed between the memory cells adjacent in the X direction.

As shown in FIGS. 2 and 3, the $n^-$-type impurity diffusion layer that constitutes both the source regions 2 and the drain regions 3 of the memory cells connects the memory cells with each other along the Y direction, while serving as a sub-bit line SBL (in FIG. 2, the $SBL_3$ and in FIG. 3, the $SBL_4$). This means that the sub-bit line SBL made of the buried impurity diffusion layer functions as a diffusion layer wiring. Further, an interlayer dielectric film 8 is formed around the wordlines WL and insulates the wordlines WL from one another.

Some of main-bit lines MBL are formed on the interlayer dielectric film 8 and the other main-bit lines MBL are formed above the interlayer dielectric film 8. The main-bit lines MBL, as shown in FIG. 1, are formed in such a manner that even-numbered main-bit lines ($MBL_2$, $MBL_4$, . . . ) are first formed and odd-numbered main-bit lines (MBL$_1$, MBL$_3$, . . . ) are then formed above them with the even- and odd-numbered main-bit lines located alternately above and below. The even-numbered main-bit lines (MBL$_2$, MBL$_4$, . . . ) are formed on the interlayer dielectric film 8 and insulated by a second interlayer dielectric film 13 from one another and from the odd-numbered main-bit lines (MBL$_1$, MBL$_3$, . . . ) (see FIG. 3). The odd-numbered main-bit lines (MBL$_1$, MBL$_3$, . . . ) are formed on the second interlayer dielectric film 13 and insulated by a third interlayer dielectric film 15 from one other (see FIG. 2).

The even-numbered main-bit lines (MBL$_2$, MBL$_4$, . . . ) are connected to even-numbered sub-bit lines (SBL$_2$, SBL$_4$, . . . ) by bit-line contacts 11 (corresponding to the bit-line contacts BC in FIG. 11) formed in the interlayer dielectric film 8 (see FIG. 3). The odd-numbered main-bit lines (MBL$_1$, MBL$_3$, . . . ) are connected to odd-numbered sub-bit lines (SBL$_1$, SBL$_3$, . . . ) by the bit-line contacts 11 formed in the interlayer dielectric film 8, by bit-line contacts 14 formed in the interlayer dielectric film 13 and by connection pads 12$a$ for connecting the bit-line contacts 11 to the bit line-contacts 14.

The connection pad 12$a$ is so formed as to avoid a poor connection caused by a positional shift between the bit-line contact 11 and the bit-line contact 14. The connection pad 12$a$ is larger in diameter than the bit-line contact 11 and than the bit-line contact 14. The connection pad 12$a$ is made of the same material as that used for the even-numbered main-bit line MBL (MBL$_2$, MBL$_4$, . . . ), simultaneously with the formation of the even-numbered main-bit line MBL (MBL$_2$, MBL$_4$, . . . ).

FIG. 1 schematically shows capacities 9 existing between the adjacent main-bit lines MBL.

As shown in FIGS. 2 and 3, selection gates SG (SG$_1$ to SG$_4$) each constituted of a switching element such as a transistor or the like are formed between the main-bit lines MBL and the sub-bit lines SBL for selectively connecting each sub-bit line SBL to the main-bit line MBL, so that the voltages of the main-bit line is applied to each sub-bit line SBL through the corresponding selection gate SG per block defined as an area between the selection gate SG and the isolation region 10. According to the present embodiment, two sub-bit lines SBL are connected to one main-bit line MBL.

Figure 10:
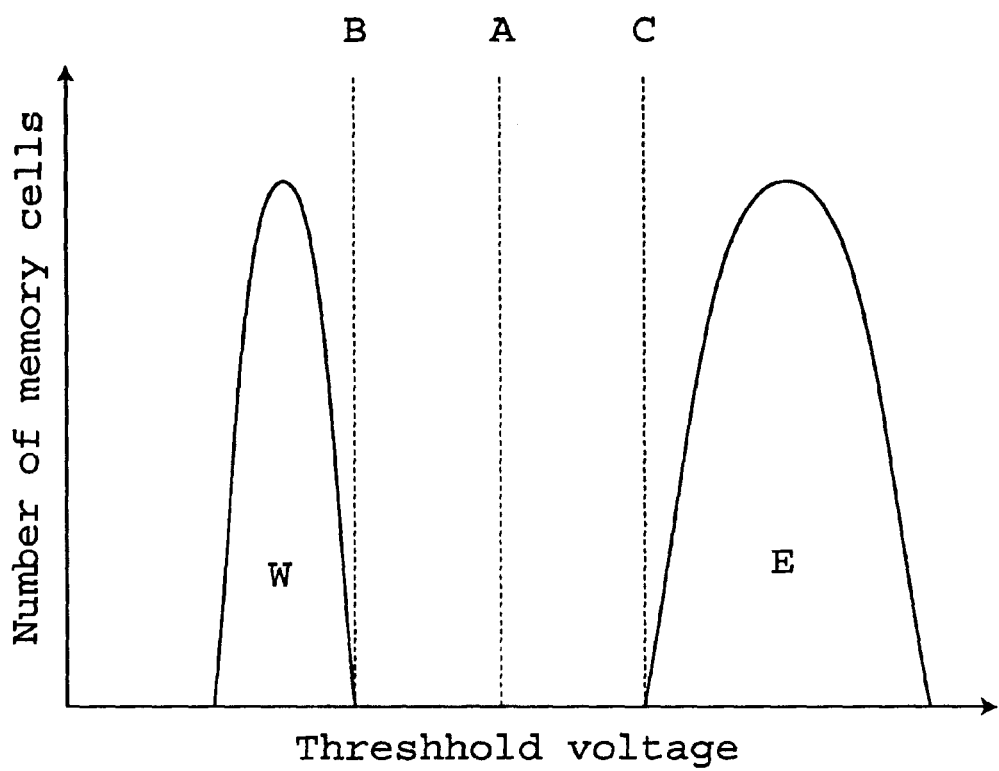
FIG. 10 is a distribution graph of threshold voltage plotted against the number of memory cells after writing of the ACT-type memory shown in FIGS. 1 to 3.
Figure 17:
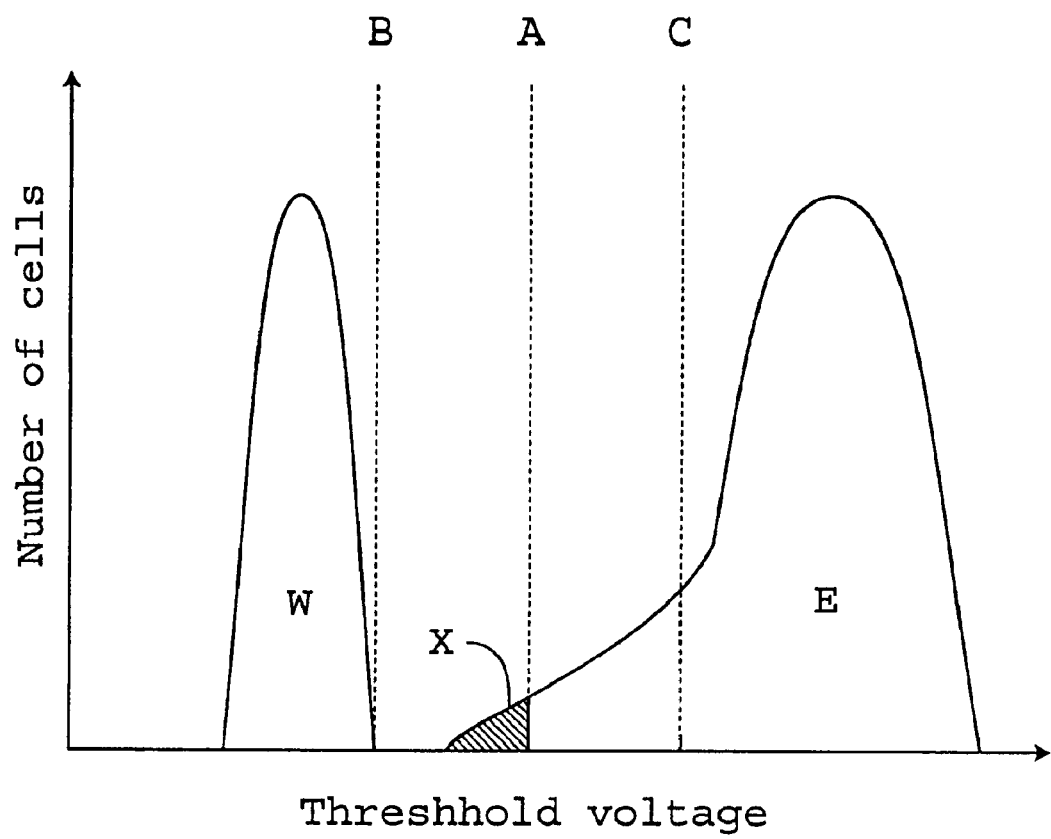
FIG. 17 is a distribution graph of threshold value plotted against the number of memory cells after writing of the ACT-type memory of the prior art.

FIG. 10 is a distribution graph of threshold voltage plotted against the number of memory cells after writing of a memory array with the above structure. In FIG. 10, the lines A, B and C denote the reference voltages in reading operation, write-verify operation and erase-verify operation respectively. The curve W denotes the distribution of threshold voltages in written memory cells. The curve E denotes the distribution of threshold voltages in erased memory cells. For comparison, the writing is performed under the same conditions as those in FIG. 17. Namely, +4V is applied to a selected main-bit line MBL and a non-selected main-bit line MBL is put in a 0V floating state. For example, in the case where a non-selected cell C$_{33}$ is sandwiched between two selected cells C$_{23}$ and C$_{43}$ (see FIG. 14), +4V is applied to each of the selected main-bit lines MBL$_2$ and MBL$_4$, while the non-selected main-bit line MBL$_3$ is put in a 0V floating state.

According to the present invention, since as shown in FIG. 1, the distance between the adjacent main-bit lines MBL is long and therefore the capacity 9 is small, a non-selected main-bit line MBL, which is put in a 0V floating state, is less susceptible to the influence of voltages applied to a selected main-bit lines MBL and is maintained substantially at 0V. As a result, electrons are not extracted from the floating gate 5 of a non-selected cell, so that it is possible to prevent lowering the threshold voltage shown in FIG. 10, and thereby to prevent error-writing in a non-selected cell.

Figure 4:
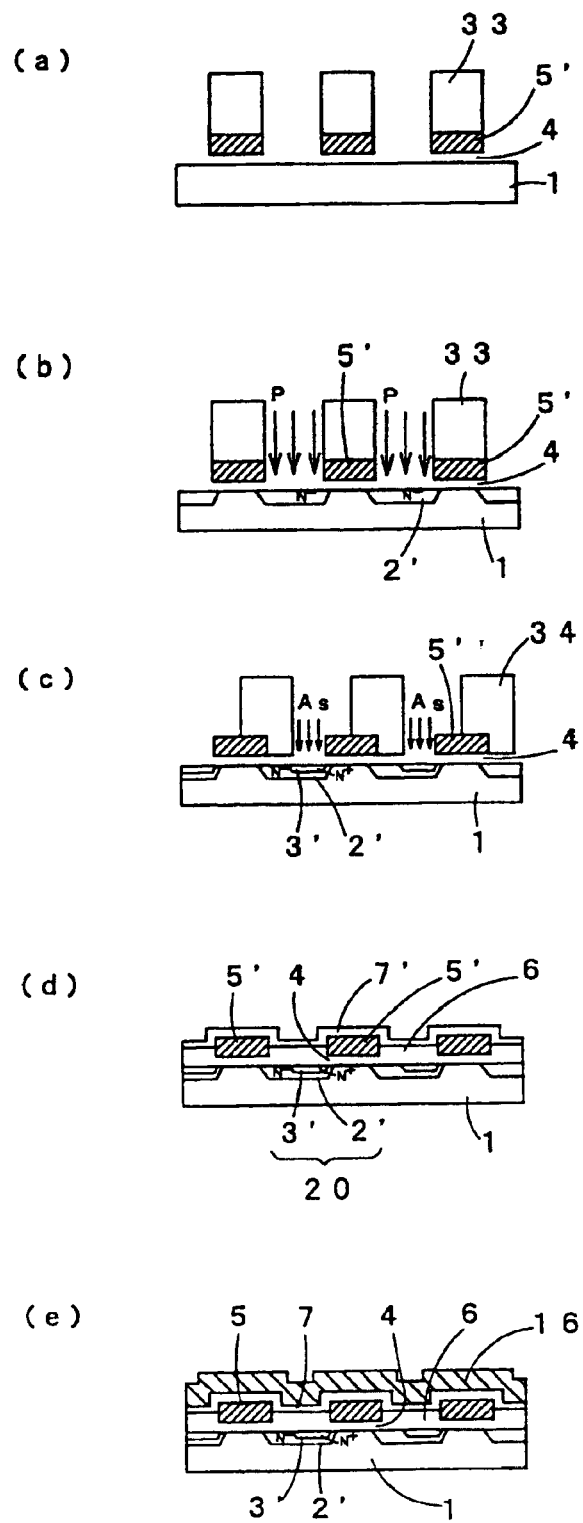
FIGS. 4(a) to 4(e) are steps for producing the ACT-type memory according to the embodiment of the present invention.

Next, an explanation will be given to a process for producing an ACT-type flash memory with the above-mentioned structure. FIGS. 4($a$) to 4($e$) are views, in the process for producing an ACT-type flash memory, for explaining the step of forming elements of an ACT-type flash memory cell to the step of forming the control gates (wordlines).

First, element isolation films (not illustrated) are formed for isolating the memory cells (for example, C$_{32}$ and C$_{33}$ of FIG. 11) adjacent in the Y direction from one another.

Next, the tunnel oxide film 4 with a thickness of about 80 Å is formed by thermal oxidation, and then a first polysilicon film 5' (a portion of which will finally become the floating gate 5) is deposited thereon to a thickness of about 1000 to 2000 Å. Further, a first resist mask 33 with a predetermined pattern is formed on the first polysilicon film 5' by photolithography, and the resultant first polysilicon film 5' is patterned in a later described manner into the shape of stripes each having the same width as that of the floating gate 5 in the channel direction (FIG. 4($a$)).

Subsequently, phosphorous ions are implanted with energy of 50 KeV in a dose amount of $3\times10^{13}/cm^2$. A region in which the phosphorous ions are implanted will become a low-concentration n$^-$-type impurity diffusion layer 2' (a portion of which functions as the source region 2) (FIG. 4($b$)).

Thereafter, the first resist mask 33 is removed, a second resist mask 34 with a predetermined pattern having openings corresponding to regions which will finally become the drain regions 3 is formed, arsenic ions are implanted with an energy of 70 KeV in a dose amount of $1\times10^{15}/cm^2$. The region in which the arsenic (As) ions are implanted will become a high-concentration n$^+$-type impurity diffusion layer 3' (which functions as the drain region 3) (FIG. 4($c$)).

After the second resist mask 34 is exfoliated, the resultant substrate is subjected to thermal oxidation under a nitrogen atmosphere at 900° C. for 10 min., so that the high-concentration n$^+$-type impurity diffusion layer 3' is allowed to have a DDD structure (Double Diffused Drain structure) and the low-concentration n-type impurity diffusion layer 2' a LDD structure (Lightly Doped Drain structure).

The low-concentration n$^-$-type impurity diffusion layer 2' and the high-concentration n$^+$-type impurity diffusion layer 3' constitute one continuous diffusion layer, which serves as a sub-bit line 20 (in FIG. 1, SBL).

Thereafter, an oxide film 6' (not illustrated) is deposited by CDV and etched back to form buried oxide films 6 between the stripes of the first polysilicon film 5'. Then, an ONO film (oxide film/nitride film/oxide film) 7' is deposited on the buried oxide films 6 and on the stripes of the first polysilicon film 5'.

Then, a second polysilicon film 16' (portions of which will finally become the control gates 16) is deposited to about 1000 Å, and then the second polysilicon film 16', the ONO film 7' and the first polysilicon film 5' are patterned using photolithography to form the control gates 16, the buried oxide films 6 and the floating gates 5 (FIG. 4($e$)).

The control gates 16 are continuously formed, thereby constituting one wordline WL.

Figure 5:
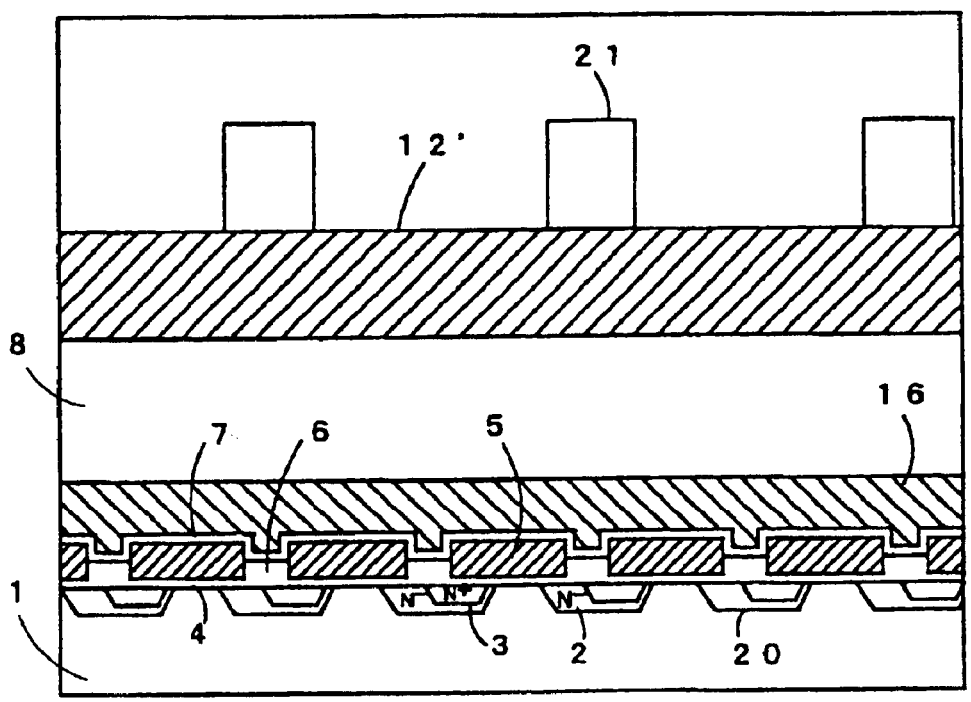
FIG. 5 is a step for producing the ACT-type memory according to the embodiment of the present invention.
Figure 6:
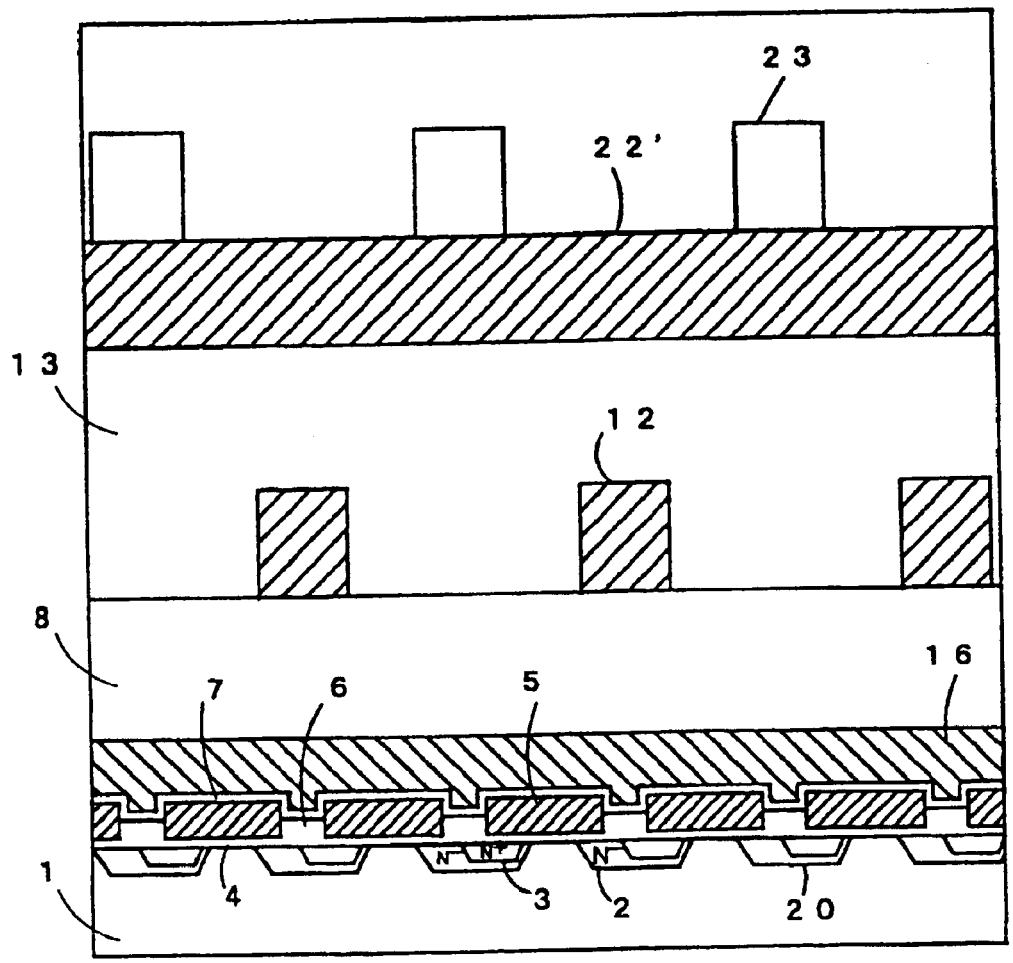
FIG. 6 is a step for producing the ACT-type memory according to the embodiment of the present invention.
Figure 7:
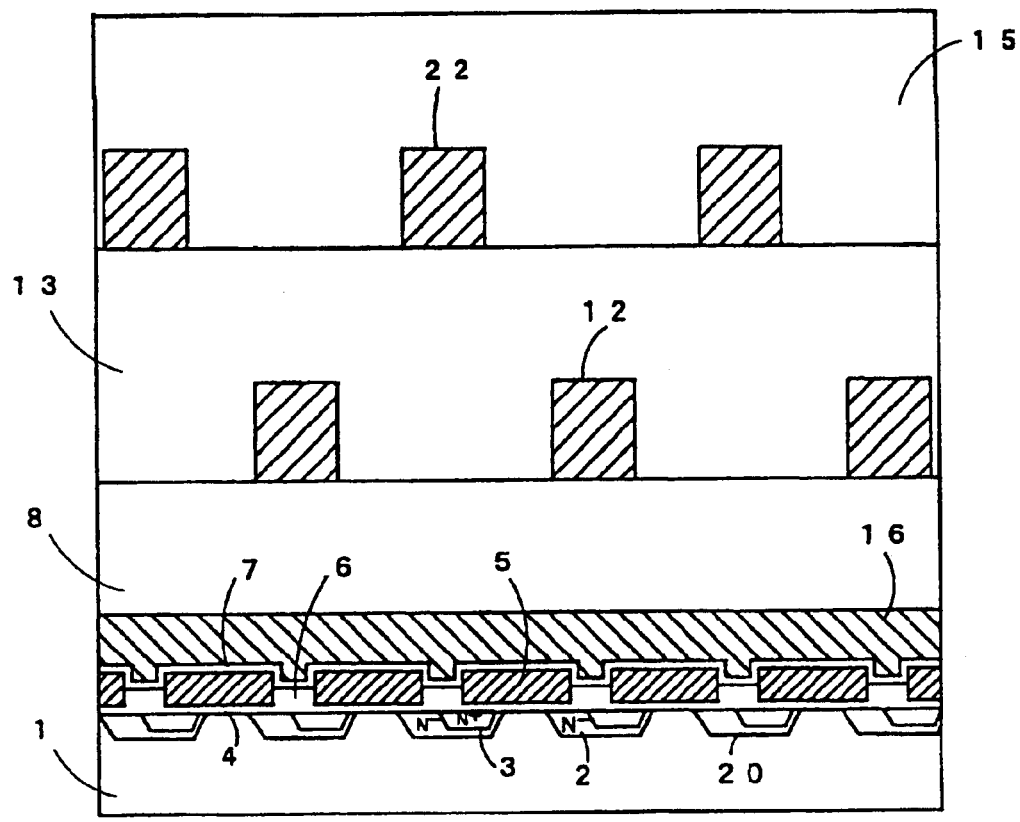
FIG. 7 is a step for producing the ACT-type memory according to the embodiment of the present invention.

FIGS. 5 to 7 are views illustrating the steps for forming first-layer main-bit lines 12 (corresponding to the MBL$_2$, MBL$_4$ and MBL$_6$ in FIG. 1) and second-layer main-bit lines 22 (corresponding to the MBL$_1$, MBL$_3$ and MBL$_5$ in FIG. 1) above the control gates 16 (corresponding to the counterparts in FIG. 1) provided in the steps of FIGS. 4(a) to 4(e).

As shown in FIG. 5, the first interlayer dielectric film 8 is deposited to about 10000 Å on the control gates 16 (i.e., the wordline WL) and planarized by chemical mechanical polishing (CMP) or the like. The first interlayer dielectric film 8 is made preferably of a CVD oxide film or an insulating film with a small dielectric constant.

Thereafter, contacts (not illustrated, corresponding to the bit-line contact 11 in FIGS. 2 and 3) are formed for connecting together the first- and second-layer main-bit lines 12 and 22 which will be formed in a later step. These contacts are obtained by forming holes and embedding a conductive material therein.

Subsequently, a first wiring material 12' (portions of which will finally become the first-layer main-bit lines 12) is deposited to about 5000 Å. The first wiring material 12' is made preferably of a metal (for example, aluminum or copper). A resist 21 is applied and patterned by photolithography such that portions of the resist 21 remain at positions where the first-layer main-bit lines 12 and connection pads 12a will be formed (see FIG. 2).

Next, as shown in FIG. 6, the first wiring material 12' is selectively removed by etching to form the first layer main-bit lines 12 and the connection pads 12a simultaneously (see FIG. 2), followed by exfoliating the remaining portions of the resist 21.

Then, the second interlayer dielectric film 13 is deposited to 25000 Å and planarized by chemical mechanical polishing (CMP) or the like. The second interlayer dielectric film 13 may be made of the same material as that used for the first interlay dielectric film 8. After that, contacts (corresponding to the bit-line contacts 14 in FIG. 2) are formed for connecting the second layer main-bit lines 22 to the connection pads 12a (see FIG. 2). These contacts are formed also by forming contact holes and embedding a conductive material therein.

Subsequently, a second wiring material 22' (portions of which will finally become the second-layer main-bit lines 22) is deposited to about 5000 Å. The second wiring material 22' is made preferably of the same metal material as that used for the first wiring material 12'.

Thereafter, a resist 23 is applied and patterned by photolithography so that portions of the resist 23 remain at positions where the second-layer main-bit lines 22 will be formed.

Next, as shown in FIG. 7, the second wiring material 22' is selectively removed by etching to form the second layer main-bit lines 22, followed by exfoliating the remaining portions of the resist 23. Finally, a BPSG (boron phosphorous silicate glass) protective film functioning as the third interlayer dielectric film 15 (in this embodiment, a top interlayer dielectric film) is deposited to about 20000 Å.

After that, various contacts are formed, pads of aluminum are formed and the like steps are carried out to complete wirings shown in the equivalent circuit of FIG. 14. Thus, the ACT-type flash memory is obtained.

Figure 8:
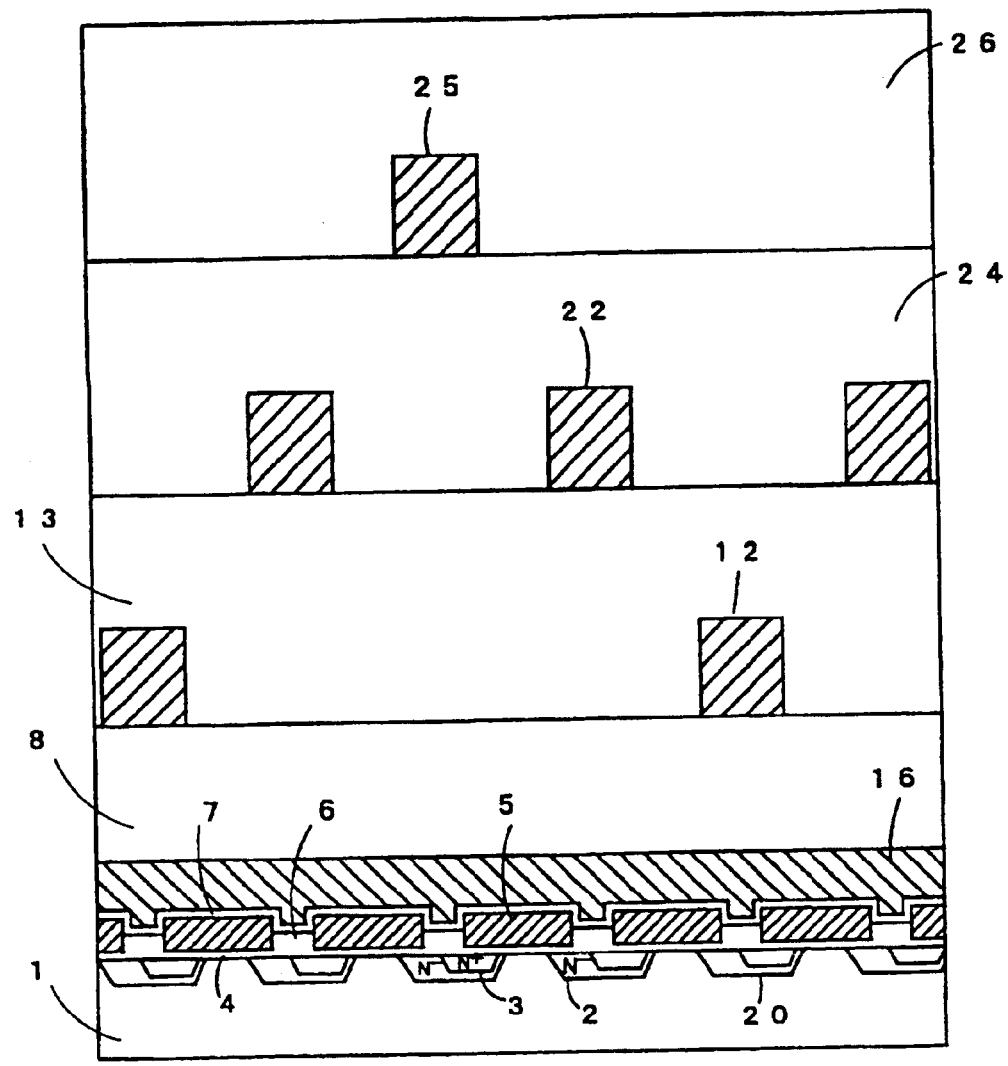
FIG. 8 is a cross section taken along a wordline of an ACT-type memory according to another embodiment of the present invention.

The above embodiment is given only by way of an example, and as shown in FIG. 8, the memory may further include a fourth interlayer dielectric layer 24, third-layer main-bit lines 25 and a BPSG film 26 so that main-bit lines of three-layered structure may be provided.

Figure 9:
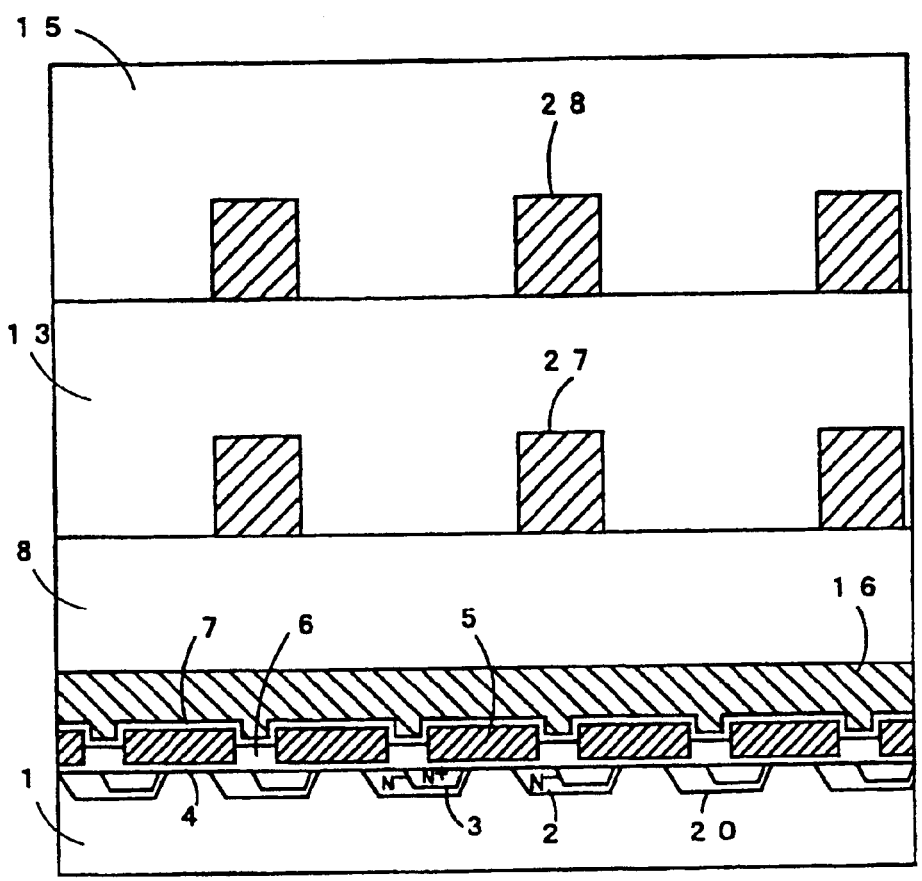
FIG. 9 is a cross section taken along a wordline of an ACT-type memory according to still another embodiment of the present invention.

In the above embodiment, the main-bit lines MBL are arranged directly above the sub-bit lines, but such an arrangement is not necessarily required. As shown in FIG. 9, the main-bit lines MBL may be not in a staggered arrangement but may be of such a two-layered structure that the second-layer main-bit lines 28 are arranged directly above the first-layer main-bit lines 27. This two-layered structure can be attained because the distance between the upper-layer main-bit lines and the lower-layer main-bit lines in the present embodiment is 10 times the distance between the adjacent main-bit lines in a horizontal direction in prior art, and allows the capacity 9 to be sufficiently small even if the upper layer main-bit lines are arranged directly above the lower-layer main-bit lines.

With this two-layered structure where the second-layer main-bit lines 28 are arranged directly above the sub-bit lines, the second-layer main-bit lines 28 can be extended laterally so that the contacts 14 can be connected to the contacts 11 by the connection pads 12a.

Hereinabove, the ACT-type memory is employed in an embodiment of the present embodiment. However, the present invention is not limited thereto, but it is applicable to any flash memories as long as data are written upon them by application of a high voltage to their bit lines.

For example, other than the ACT-type flash memory where ACT-type memory cells are arranged in an array, the present invention is applicable to a flash memory with NOR-type cells, DINOR-type cells, NAND-type cells and AND-type cells where cells are susceptible to the influence of the voltage of their adjacent ones.

In short, the present invention is applicable to nonvolatile semiconductor memories where sub-bit lines are connected so that a high voltage is applied to drain regions or source regions formed in a semiconductor substrate, and main-bit lines for applying the high voltage to the sub-bit lines are formed above the semiconductor substrate via an interlayer dielectric film.

According to the nonvolatile semiconductor memory device of the present invention, the adjacent two of the main-bit lines are located on different dielectric layers, such that the distance therebetween is long enough that there is a so small capacity between the adjacent main-bit lines. As a result, the non-selected main-bit line being put in a 0V floating state at the writing operation is less affected by the voltage applied to the selected main-bit line, thereby enabling the nonvolatile semiconductor memory device in which error-writing is prevented.

Further, because of the small interline capacities between any adjacent main-bit lines owing to the long distance therebetween, it is provided the memory device with high degree of integration and high reliability in writing operation.

Moreover, when applied to the ACT-type memory device, because of the low writing current, it is provided the memory device giving good power consumption in writing operation and maintaining the writing rate.

What is claimed is:

1. A nonvolatile semiconductor memory device, comprising:
a group of memory cells formed in X and Y directions in and on a semiconductor substrate, the X and Y directions crossing each other, each memory cell including source and drain regions formed in the substrate, a first insulating film formed on a surface of the substrate between the source and drain regions, a floating gate formed on the first insulating film, and a control gate formed above the floating gate via a second insulating film;

a plurality of wordlines each connected to the control gates of the memory cells in the X direction;

a plurality of sub-bit lines, each sub-bit line connected to a predetermined number of source and drain regions of the memory cells in the Y direction;

a plurality of main-bit lines extending in the Y direction, each main-bit line being connected to the sub-bit line in the Y direction, and a plurality of dielectric layers laminated on the sub-bit lines, wherein each main-bit line is formed on any one of the plurality of dielectric layers, each main-bit line being connected to the corresponding sub-bit line via a conductive member penetrating through the dielectric layer under the main-bit line, and adjacent two of the main-bit lines are located on different dielectric layers.

2. The nonvolatile semiconductor memory device of claim 1, wherein the sub-bit line is positioned between adjacent two of the memory cells in the X direction and comprises a first and second diffusion layers, the first diffusion layer being heavily impurity-doped and located below the floating gate of one memory cell to serve as the source region, the second diffusion layer being lightly impurity-doped and located below the floating gate of the other memory cell to serve as the drain region.

3. The nonvolatile semiconductor memory device of claim 1, wherein the main-bit line is made of a metal.

4. The nonvolatile semiconductor memory device of claim 1, wherein each main-bit line is formed directly above the sub-bit line connected thereto by the bit-line contact.

5. The nonvolatile semiconductor memory device of claim 1, wherein the dielectric layers consists of a first dielectric layer above the sub bit lines and a second dielectric layer on the first dielectric layer, wherein the main bit lines consist of a plurality of first-layer main-bit lines formed on the first dielectric layer and a plurality of second-layer main-bit lines formed on the second dielectric layer, wherein the conductive member connecting the second-layer main-bit line and the corresponding sub-bit line consists of a first member passing through the first dielectric layer, a second member passing through the second dielectric layer and a connection pad to connect the first member and the second member, the connection pad being formed on the first dielectric layer.

6. The nonvolatile semiconductor memory device of claim 5, wherein the second-layer main-bit line is arranged directly above the first-layer main-bit line provided with a laterally extended connection portion, wherein the first member is located perpendicularly on the sub-bit line, wherein the second member is located perpendicularly under the connection portion of the main-bit line.

7. The nonvolatile semiconductor memory device of claim 5, wherein the connection pad is made of the same material as that used for the first-layer main-bit line and is formed simultaneously with the formation thereof.

* * * * *